(12) United States Patent
Savidis et al.

(10) Patent No.: US 9,912,325 B2
(45) Date of Patent: Mar. 6, 2018

(54) POWER SUPPLY VOLTAGE DETECTION AND POWER DELIVERY CIRCUIT

(71) Applicant: Drexel University, Philadelphia, PA (US)

(72) Inventors: Ioannis Savidis, Wallingford, PA (US); Divya Pathak, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 15/096,046

(22) Filed: Apr. 11, 2016

(65) Prior Publication Data

US 2016/0301400 A1 Oct. 13, 2016

Related U.S. Application Data

(60) Provisional application No. 62/145,624, filed on Apr. 10, 2015.

(51) Int. Cl.
*H03K 5/01* (2006.01)
*H03K 5/08* (2006.01)

(52) U.S. Cl.
CPC ....................... *H03K 5/08* (2013.01)

(58) Field of Classification Search
None
See application file for complete search history.

(56) References Cited

U.S. PATENT DOCUMENTS

| | | | | |
|---|---|---|---|---|
| 7,739,531 B1* | 6/2010 | Krishnan | ............... | G06F 1/3203 713/300 |
| 2004/0183613 A1* | 9/2004 | Kurd | ........................ | G01K 7/32 331/186 |
| 2007/0201294 A1* | 8/2007 | Ozawa | ..................... | G11C 5/14 365/226 |
| 2014/0184262 A1* | 7/2014 | Poindexter | ......... | G01R 31/2853 324/759.03 |
| 2015/0192942 A1* | 7/2015 | Smith | ..................... | G05F 1/462 327/540 |

OTHER PUBLICATIONS

A. Djemouai, M. Sawan, and M. Slamani, "High performance integrated CMOS frequency-to-voltage converter," Proceedings of the Tenth International Conference on Microelectronics, Dec. 1998, pp. 63-66, Montreal, Canada.

(Continued)

*Primary Examiner* — Cassandra Cox
(74) *Attorney, Agent, or Firm* — Spruce Law Group, LLC

(57) ABSTRACT

A circuit that detects the power supply voltage requirement of each voltage domain in an IC includes 1) a ring oscillator in each voltage domain, and 2) a power module. Two different circuit implementations of the power module may provide a precise reference voltage to on-chip voltage regulators (LDO or DC-DC switching buck converter). The power module supports DVFS and can provide the desired power supply voltage for advanced CMOS technology nodes (45 nm and beyond) in less than 100 ns. The voltage detection circuit clamps the voltage to the desired level to address power supply voltage variations due to PVT and ageing. The proposed technique has minimal power and area overhead to compensate for the power supply voltage variation, thus reducing power supply voltage margins which yields higher power saving.

18 Claims, 7 Drawing Sheets

(56) References Cited

OTHER PUBLICATIONS

A. Ramazani, S. Biabani, and G. Hadidi, "CMOS ring oscillator with combined delay stages," AEU-International Journal of Electronics and Communications, Dec. 2013, pp. 515-519.

A. Teetzel and R. Walker, "A GaAs IC broadband variable ring oscillator and arbitrary integer divider," IEEE Microwave and Millimeter-Wave Monolithic Circuits Symposium, Jun. 1992. pp. 87-89, California.

Analog Devices, "ADP1821 Step-Down DC-to-DC Controller Datasheet," http://www.analog.com/static/imported-files/data_sheets/ADP1821.pdf, last visited: Jun. 12, 2017.

D. Pathak and I. Savidis, "Run-Time Voltage Detection Circuit for 3-D IC Power Delivery," Proceedings of the IEEE 27th International SoC Conference (SoCC), Sep. 2014, pp. 183-187, Philadelphia, PA.

F. Kashfi and J. Draper, "Thermal sensor design for 3D ICs," IEEE 55th International Midwest Symposium on Circuits and Systems, Aug. 2012, pp. 482-485, Marina del Rey, California.

G. Jovanovic, M. Stojcev, and Z. Stamenkovic, "A CMOS voltage controlled ring oscillator with improved frequency stability," Scientific Publications of the State University of Novi Pazar, Series A: Applied Mathematics, Informatics and Mechanics, Dec. 2010, pp. 1-9, vol. 2, No. 1.

I. Savidis and E. G. Friedman, "Closed-form expressions of 3-D via resistance, inductance, and capacitance," IEEE Transactions on Electron Devices, Sep. 2009, pp. 1873-1881, vol. 56, No. 9.

I. Savidis and E. G. Friedman, "Electrical modeling and characterization of 3-D vias," IEEE International Symposium on Circuits and Systems, May 2008, 784-787, Rochester, New York.

I. Savidis, "Characterization and Modeling of TSV Based 3-D Integrated Circuits," Ph.D. Thesis, 2013, pp. i-408, Rochester, New York.

I. Savidis, S. M. Alam, A. Jain, S. Pozder, R. E. Jones, and R. Chatterjee, "Electrical modeling and characterization of through-silicon vias (TSVs) for 3-D integrated circuits," Microelectronics Journal, Jan. 2010, pp. 9-16, vol. 41, No. 1.

J. S. Panganiban, "A ring oscillator based variation test chip," M.S. Thesis, Jun. 2002, Massachusetts Institute of Technology, pp. 1-174.

J.R. Yuan and C. Svensson, "Fast CMOS nonbinary divider and counter," Electronics Letters, Jun. 1993, pp. 1222-1223, vol. 29, No. 13.

S. Kose and E. G. Friedman, "Distributed on-chip power delivery," IEEE Journal on Emerging and Selected Topics in Circuits and Systems, Dec. 2012, pp. 704-713, vol. 2, No. 4.

S. Lopez-Buedo, J. Garrido, and E. Boemo, "Thermal testing on reconfigurable computers," IEEE Design & Test of Computers, Mar. 2000, pp. 4-11, vol. 17, No. 1, Universidad Autónoma de Madrid.

K. Zhang and A.B. Apsel, "A low-power, process-and-temperature-compensated ring oscillator with addition-based current source," IEEE Transactions on Circuits and Systems, May 2011, pp. 1-11, vol. 58, No. 5.

K. Zhang, A. M. Pappu, and A. B. Apsel, "Low variation current source for 90nm CMOS," IEEE International Symposium on Circuits and Systems, May 2008, pp. 388-391, Ithaca, NY.

\* cited by examiner

POWER SUPPLY VOLTAGE DETECTION AND POWER DELIVERY CIRCUIT

BACKGROUND

Nanoscale technologies, similar to other technologies, face challenges in high power consumption and signal delay due to global interconnects, but due to their scope, addressing these challenges opens new areas of research. One research area is through silicon via (TSV) based 3D integrated chip (IC) technology, where each layer or stratum is fabricated separately and subsequently vertically integrated. With 3D ICs, the fabrication of disparate strata and the final system integration may be completed in separate manufacturing facilities, allowing for greater efficiency and the possibility of modular layers. The packaging manufacturer performing the final bonding, thus, may not necessarily need each layer's technology-dependent parameters such as voltage levels and frequency of operation to assemble the 3D IC. This transparency-to-technology information allows for off-the-shelf integration where dies from different foundries are bonded together by the packaging manufacturer to form a heterogeneous 3D IC.

A semiconductor device scaling has exacerbated fundamental problems with CMOS technology like parametric variation and device aging. The most significant ill effect of these problems is seen through power supply voltage variation. Conventional microprocessor designs compensate for the worst case power supply voltage variation by introducing voltage guard bands which leads to a significant overhead on the total power consumption of the IC. In-situ aging sensors are deployed on microprocessors to automate the effects of circuit aging. However, a run-time aging detection and correction technique which can be used in tandem with on-chip voltage regulators is missing.

SUMMARY OF THE INVENTION

A circuit that detects the power supply voltage requirement of each voltage domain in an IC includes 1) a ring oscillator in each voltage domain, and 2) a power module. Two different circuit implementations of the power module may provide a precise reference voltage to on-chip voltage regulators (LDO or DC-DC switching buck converter). The power module supports DVFS and can provide the desired power supply voltage for advanced CMOS technology nodes (45 nm and beyond) in less than 100 ns. The voltage detection circuit clamps the voltage to the desired level to address power supply voltage variations due to PVT and ageing. The proposed technique has minimal power and area overhead to compensate for the power supply voltage variation, thus reducing power supply voltage margins which yields higher power saving.

The proposed circuit technique has another application for 3-D heterogeneous ICs. The 3-D IC may include RF, analog, micro/nano-electromechanical systems (MEMS/NEMS) as well as emerging technologies such as nano-FET and graphene-based device planes. The design and fabrication of these disparate device planes may take place at separate facilities. Unless technology specific information on each device plane is provided, the packaging facility carrying out the final 3-D integration of the device planes is unaware of the power supply voltage requirements of the different ICs. The proposed circuit detects the power supply voltage needs of each voltage domain on different device plans of the 3-D IC. This facilitates true plug-and-play integration for 3-D heterogeneous ICs.

DETAILED DESCRIPTION OF THE EMBODIMENTS

Introduction

The plug-and-play approach described above may be driven in several ways. First, organizations may develop, and the industry adopts, guidelines to standardize the interface circuit properties (location and electrical characteristics of IO ports and ESD protection) for each device plane. Second, the 3D IC stack's global power and clock-generation circuits must be met for each stratum.

The power supply voltage detection and power delivery circuit described herein provides the global power generation and distribution through a power delivery system that senses the power supply voltage needed by each voltage domain (VDD_DP) in each device plane at run time. A dedicated power plane detects each domain's power supply voltage requirement, and delivers power to all voltage domains in the 3D stack accordingly. The power plane generates a range of voltages (ideally from 0.5 V to 5 V) to meet the power supply voltage requirements of the various technology nodes. Further, device planes may have significantly varying power budgets, requiring single or multiple power planes interspersed between device planes, depending upon the 3D IC stack configuration.

The design described herein provides power to a heterogeneous device configuration that may include CMOS, MEMS, or RFICs operating on disparate substrates not limited to Silicon or III-V technologies (GaAs, GaN, InP, etc.).

II. RUN TIME VOLTAGE DETECTION AND POWER DELIVERY

Each voltage domain within each device plane includes a ring oscillator capable of generating an output frequency $F_{out}$ of 1 GHz when a control voltage equal to the power supply voltage $V_{DD\_DP}$ of the domain is applied. A 1 GHz frequency is an arbitrarily chosen value for the proposed circuit and may be adjusted based on set standards, and reflects one value that serves as a common frequency of operation for all ring oscillators placed on different device planes in a given 3-D IC stack. As proposed, the only required overhead for each voltage domain is the ring oscillator. The remaining components of the voltage sense circuit are part of the power module placed on the dedicated power plane.

Figure 1:
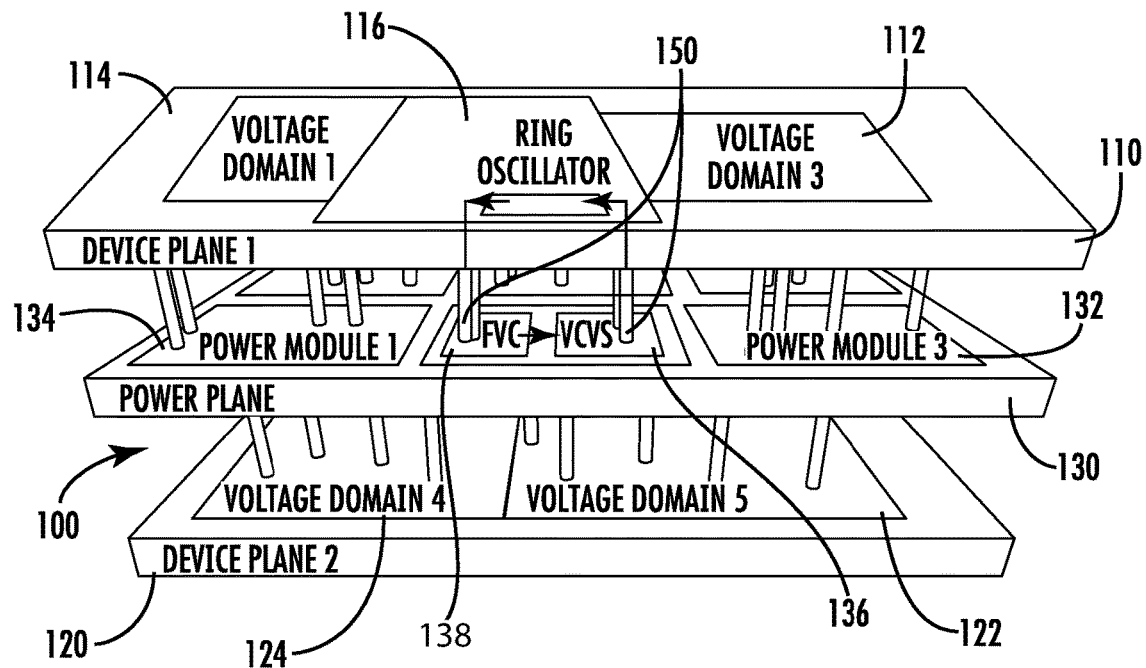
FIG. 1 shows the placement of components on the device and power planes.

FIG. 1 shows the placement of the components on the device and power planes. The 3-D stack 100 includes device planes 110, 120 containing multiple voltage domains 112, 114 and 122, 124 served by a power plane 130 with multiple power modules 132, 134. Each power module 132,134 includes a voltage-controlled voltage source (VCVS) 136 controlled by voltage generated from a frequency to voltage converter (FVC) 138. A ring oscillator 116 placed in each voltage domain provides a controlling frequency to the FVC 138.

The Fout generated by the ring oscillator 116 propagates through TSVs 150 to the power plane 130. The FVC 138 generates a voltage Vfvc inversely proportional to Fout. Vfvc is equal to 690 mV when an input frequency of 1 GHz is applied to the FVC 138. The ring oscillator frequency 116 increases until 1 GHz is reached, which is determined by comparing the FVC 138 output voltage to a reference voltage source Vref set to 690 mV. The VCVS 136 supplies the control voltage to the ring oscillator 116. The VCVS 136 is controlled by a voltage comparator that compares the Vfvc with Vref. Dedicated power modules 132, 134 comprising the FVC 138 and the VCVS 136 facilitate point of load power delivery that: 1) reduces noises due to a reduction of the parasitic impedance of the power distribution network as the voltage source is closer to the load circuit, 2) supplies different voltages to heterogeneous circuits, and 3) provides finer granularity for voltage control.

The circuit structure and operation of components included in the voltage sense and power delivery circuit are described below. Circuits may be designed with 45 nm and 22 nm PTM models for, respectively, the power plane and device plane, but circuits designed and fabricated in any technology node are plausible.

A. Ring Oscillator Circuit for Individual Voltage Domains

Ring oscillators (RO) may be used as voltage controlled oscillators (VCO) in high performance integrated circuits as the fundamental block for frequency synthesizers, clock recovery circuits, and clock distribution networks. The application of ring oscillators is not limited to VCOs, as ROs may be used for on-chip thermal sensors and test structures to measure process variability. The RO's flexibility may be attributed to a simple CMOS implementation with no passive components, which reduces the occupied silicon area. The output frequency may be stable in the presence of process, voltage, and temperature variation (PVT) and the applied control voltage.

Several ring oscillator circuit topologies may provide a steady frequency reference for the detection of the targeted VDD_DP of a given voltage domain. The selected ring oscillator circuit topology should provide a large frequency range when the applied control voltage varies from VDD_DP/2 to VDD_DP and a minimum variation in frequency due to sensitivity to PVT. A current starved RO with an output switching inverter (shown in FIG. 2) provides frequency stability in terms of temperature variation (less than 2%), a low phase noise of 0.06 radians, and frequency sensitivity to power supply variation of less than 10%.

Figure 2:
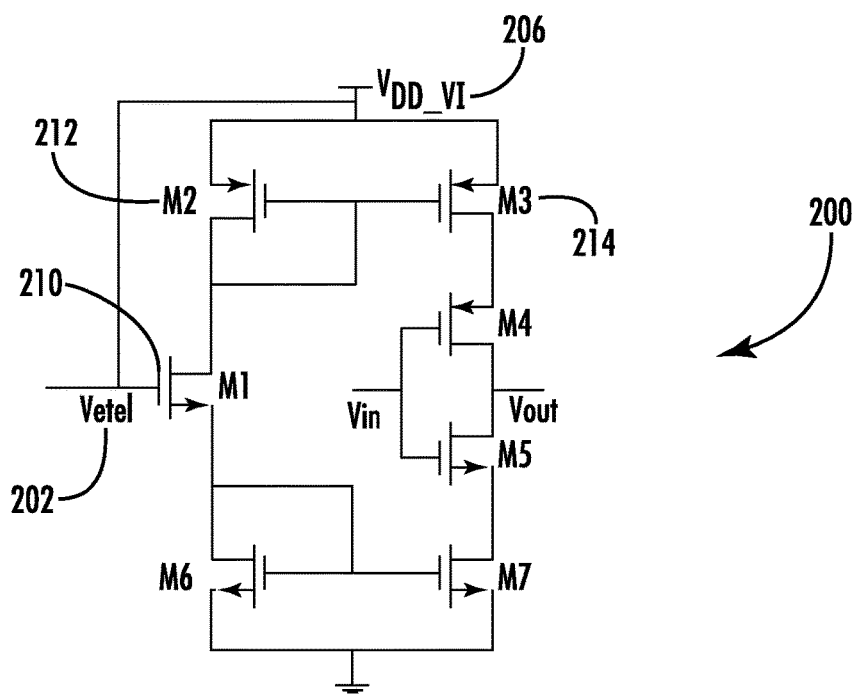
FIG. 2 shows a current starved RO with an output switching inverter.

The current-starved topology with an output switching inverter is a building block to implement the ring oscillator. The control voltage Vctrl 202 is applied to both the control transistor M1 204 and VDD_DP as shown in FIG. 2. The RO circuit 200 may be implemented using a 22 nm high-performance (HP) PTM model with a VDD_DP of 0.8 V. An output frequency of 1 GHz is achieved with three current starved inverting stages (210, 212, 214) each with transistor W/L ratios ranging between 8 to 10. None of the transistors are minimum-sized to reduce the impact of line-edge roughness and random dopant fluctuations that cause significant variation in the VTH in the subnanometer technology nodes.

Figure 4A:
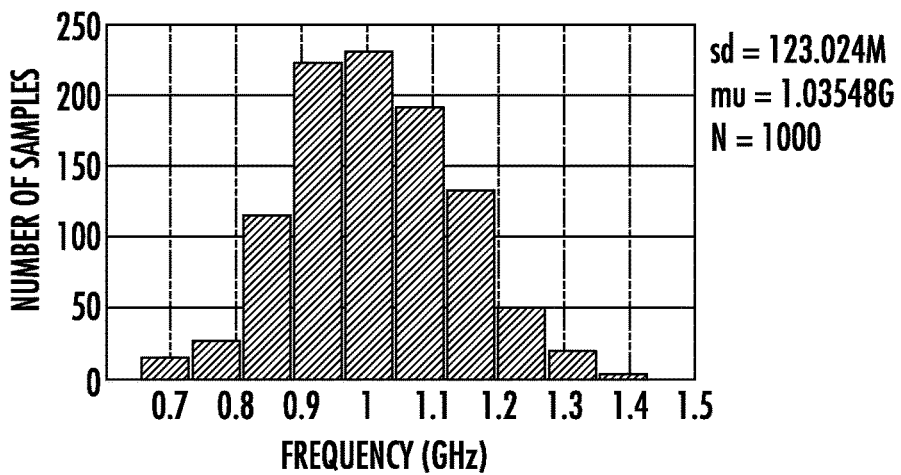
FIGS. 4(a), 4(b), and 4(c) are graphs that show the ring oscillator frequency variation with threshold voltage VTH, channel length, and MOSFET low-field mobility.
Figure 4B:
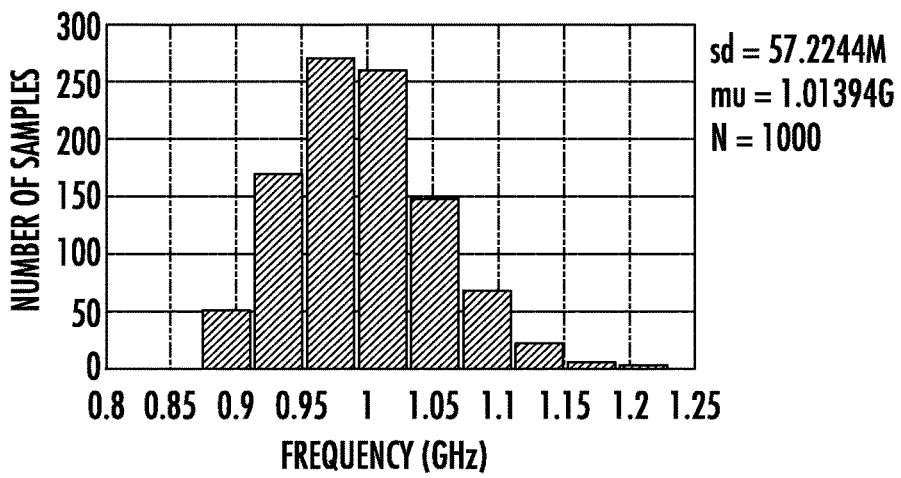
Figure 4C:
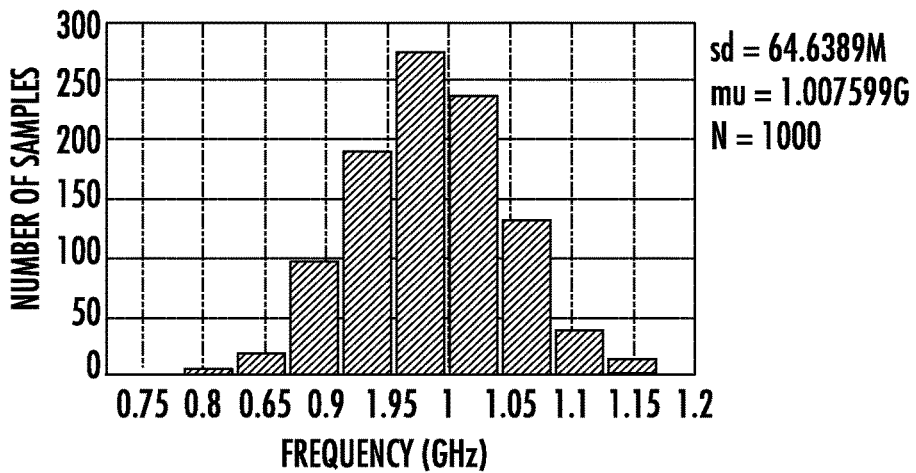

The VTH, low-field mobility, and effective channel length are three parameters impacted by lithographic variation, stress, and doping concentration in strained silicon technology. The impact of process variation on the output frequency of the ring oscillator is evaluated with Monte Carlo analysis. A typical corner is simulated for statistical variation of VTH, channel length, and mobility considering both process variation and device mismatch. The ring oscillator frequency variation with VTH, channel length, and MOSFET low-field mobility is shown, respectively, in FIGS. 4(a), 4(b), and 4(c).

The corresponding ratio of the variance to the mean for VTH, the effective channel length, and the low-field mobility as a percentage are, respectively, 11.9%, 5.64%, and 6.12%. The ring oscillator therefore exhibits moderate deviation in output frequency with process variation. The power module on the power plane that detects the ring oscillator frequency is designed to compensate for deviation from the 1 GHz target frequency due to PVT variation to ensure reliable detection and setting of the power supply voltage.

B. Frequency to Voltage Converter Circuit

The output from the ring oscillator 116 on the device planes 110, 120 is connected to an FVC circuit 138 placed on the dedicated power plane 130. The connection between the ring oscillator 116 and the FVC 138 is through TSVs 150. With careful floor planning and the development of 3-D IC interface circuit standards, the vertical alignment of the ring oscillators 116 and the FVC circuits 138 on the respective device and power planes ensures minimum electrical degradation of the frequency signal in terms of induced jitter and propagation delay. The FVC 138 operates based on charge redistribution between two switching capacitors. The generated output voltage is linearly related to the input frequency and does not require filtering to remove AC ripples, which is a common limitation with other FVC implementations using low pass filtering techniques or digital counters. The circuit implementation is area efficient, as a limited number of components are required. The FVC circuit 138 is implemented using a 45 nm low-performance (LP) PTM model with the power supply voltage VDD_PP set to 1 V.

Figure 5:
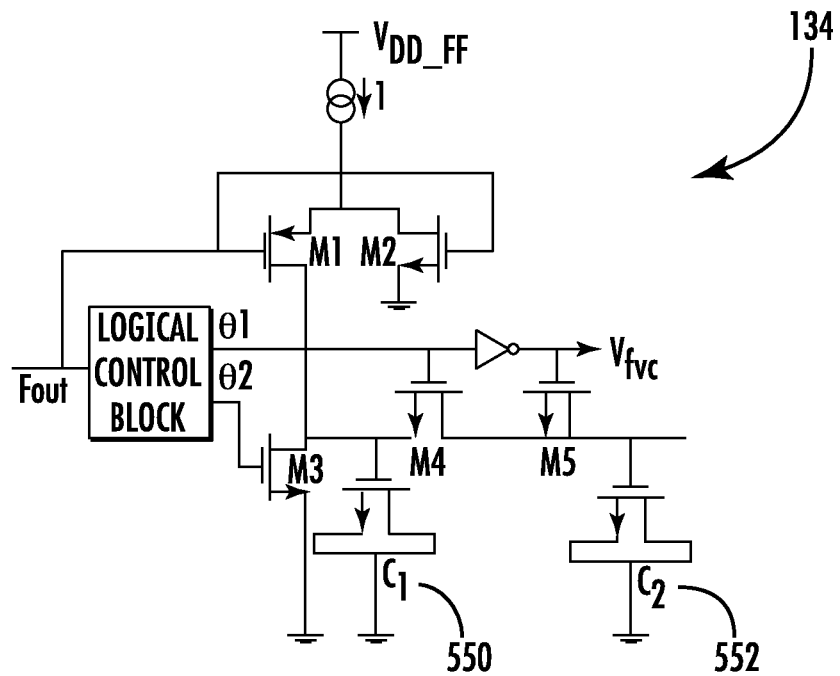
FIG. 5 shows the circuit implementation of a Frequency to Voltage Converter (FVC).

FIG. 5 shows a circuit implementation of the FVC 138 with transistors M1-M5. The current source may be set to 20 µA. The capacitors C1 550 and C2 552 may be each 10 fF and implemented as MOSCAPS to reduce the occupied silicon area. The voltage across the capacitors 550, 552 is inversely proportional to the frequency of the input signal and corresponds to a voltage of 690 mV when the input frequency is 1 GHz.

C. Voltage-Controlled Voltage Source Implementation

Figure 6:
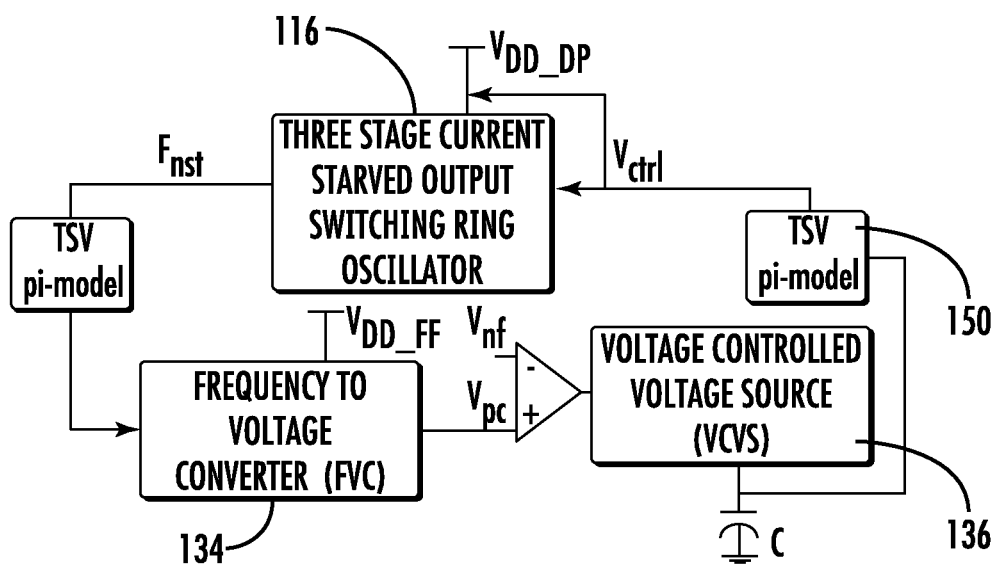
FIG. 6 shows a Voltage Controlled Current Source (VCVS) comprising a voltage comparator and a current source that charges a capacitor C.

As shown in FIG. 6, the control voltage (Vctrl) and power supply voltage (VDD_DP) of the RO in the device plane are provided by a voltage controlled voltage source (VCVS 136) that is part of the power module in the power plane 130. The VCVS 136 includes a voltage comparator and a current source that charges a capacitor C. The charging of the capacitor through the current source is controlled by the output of the voltage comparator. The VCVS 136 is implemented using the 45 nm thick oxide PTM model available through the NCSU 45 nm PDK. The current source is designed to generate stable output voltages up to 3 V, which is sufficient to serve analog and IO devices implemented in subnanometer technologies. It is possible to generate output voltages up to 5 V by selecting an older technology node (greater than 65 nm) to implement the current source on the dedicated power plane 130. By supplying voltages from 0.5 V to 5 V, a wide range of disparate technologies are integrated to form a 3-D system.

The ring oscillator 116 generates distinct frequencies when the input control voltage lies between VDD_DP/2 and VDD_DP. The FVC 138 responds to these frequencies by generating an output voltage inversely proportional to the input frequencies. The varying output voltage from the FVC 138 is constantly compared to Vref. When Vfvc is equal to or less than Vref, the comparator output becomes active low and stops the charging of the capacitor C through the current source, as shown in FIG. 6.

III. SIMULATION RESULTS

Figure 7A:
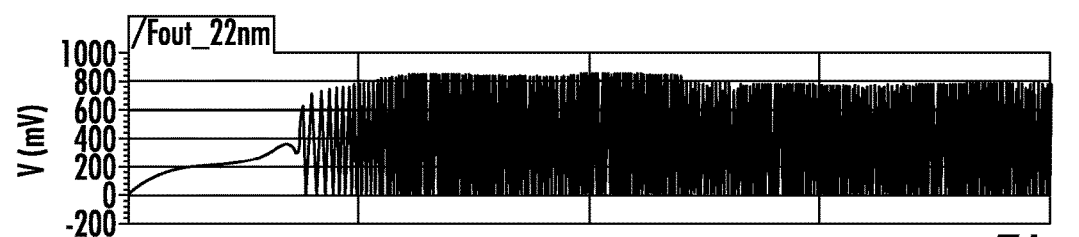
FIG. 7 shows the transient response of the 22 nm ring oscillator (Fout_22 nm), the FVC output voltage (Vfvc), and the control voltage generated by the VCVS block (Vctrl_22 nm).
Figure 7B:
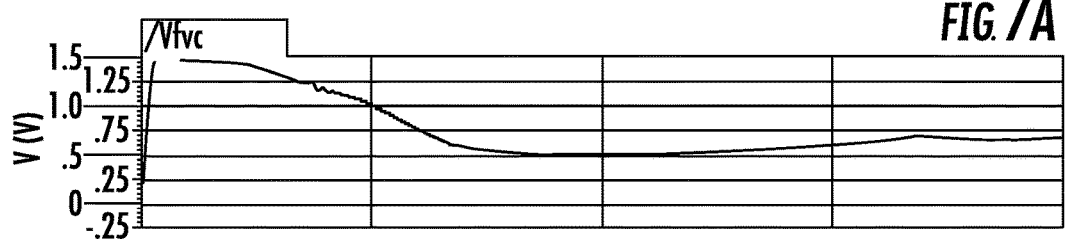

The three circuit blocks, which include the 22 nm three stage current starved output switching ring oscillator circuit on the device plane (power supply voltage VDD_DP of 0.8 V), the 45 nm FVC circuit (power supply voltage VDD_PP of 1 V), and the 45 nm VCVS, are simulated together. The simulation also includes the impedance of the TSVs. The connectivity of the circuit blocks is shown in FIG. 6 and the transient response is shown in FIG. 7. Assuming a vertical alignment between the power module on the power plane and the ring oscillator on the device plane, the interconnect length is negligible and is not considered in the simulation.

The control voltage from the VCVS and the output signal of the ring oscillator propagate through TSVs. The impact of the TSVs is incorporated by using an equivalent RC pi-model. The values of the DC resistance (505.8 mΩ), 1 GHz resistance (570.72 mΩ), and capacitance (8.7 fF) of a single TSV are computed from closed form expressions. The pi-model represents a Tungsten filled TSV with a length of 16 μm, diameter of 1.5 μm, and dielectric thickness of 0.25 μm. Each RC pi-model shown in FIG. 6 represents two TSVs in parallel.

Figure 7C:
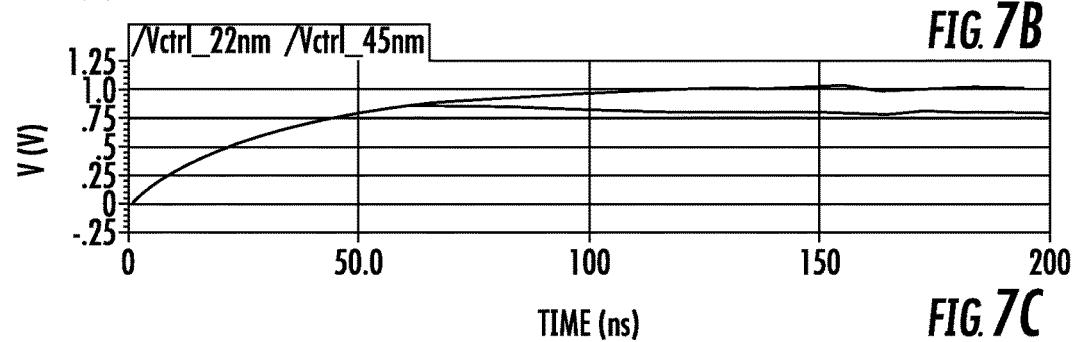

FIG. 7 shows the transient response of the 22 nm ring oscillator (Fout_22 nm), the FVC output voltage (Vfvc), and the control voltage generated by the VCVS block (Vctrl_22 nm). The ring oscillator is the only load element served by the power module for the transient simulation. The VCVS transient simulation therefore excludes the impact of load transients and resistive losses due to the power delivery network and additional load circuits. The desired power supply voltage of 0.8 V is reached in less than 80 ns. The proposed voltage detection and power delivery circuit is further tested to provide the power supply voltage to a 45 nm device plane. A three-stage current starved ring oscillator is designed using a 45 nm LP PTM model (VDD_DP of 1 V). The VCVS is able to reliably generate a control voltage of 1 V (Vctrl_45 nm) in less than 100 ns, as shown in FIG. 7(c).

IV. UNIVERSAL POWER PLANE

Through silicon via (TSV) based 3D integrated circuits (IC) permit the integration of heterogeneous technologies with CMOS. The integrated system may include RF, analog, micro-nano-electromechanical systems (MEMS/NEMS) as well as emerging technologies such as nano-FET and graphene-based device planes. The design and fabrication of these disparate device planes may take place at separate facilities. Unless technology specific information on each device plane is provided, the packaging facility carrying out the final 3D integration of the device planes may be unaware of the power supply voltage requirements of the different ICs.

A universal power plane comprises circuits capable of detecting the power supply voltage requirement of each device plane in the 3-D IC stack. The universal power plane may have multiple on-chip voltage regulators serving the power needs of each voltage domain in each device plane of the 3D stack. This arrangement facilitates point-of-load power delivery through the use of TSVs. The shorter path between the power source and load leads to both lower IR drop and parasitic impedance of the power distribution network. Each dedicated voltage regulator for a given voltage domain facilitates dynamic voltage and frequency scaling (DVFS). 3D IC interface guidelines would help to successfully implement this circuit, and would include specifications for the location of ports for power, clock, and signal delivery for each device plane of the 3D IC stack.

V. ALTERNATE POWER SUPPLY DETECTION AND CLAMPING CIRCUIT

Figure 8:
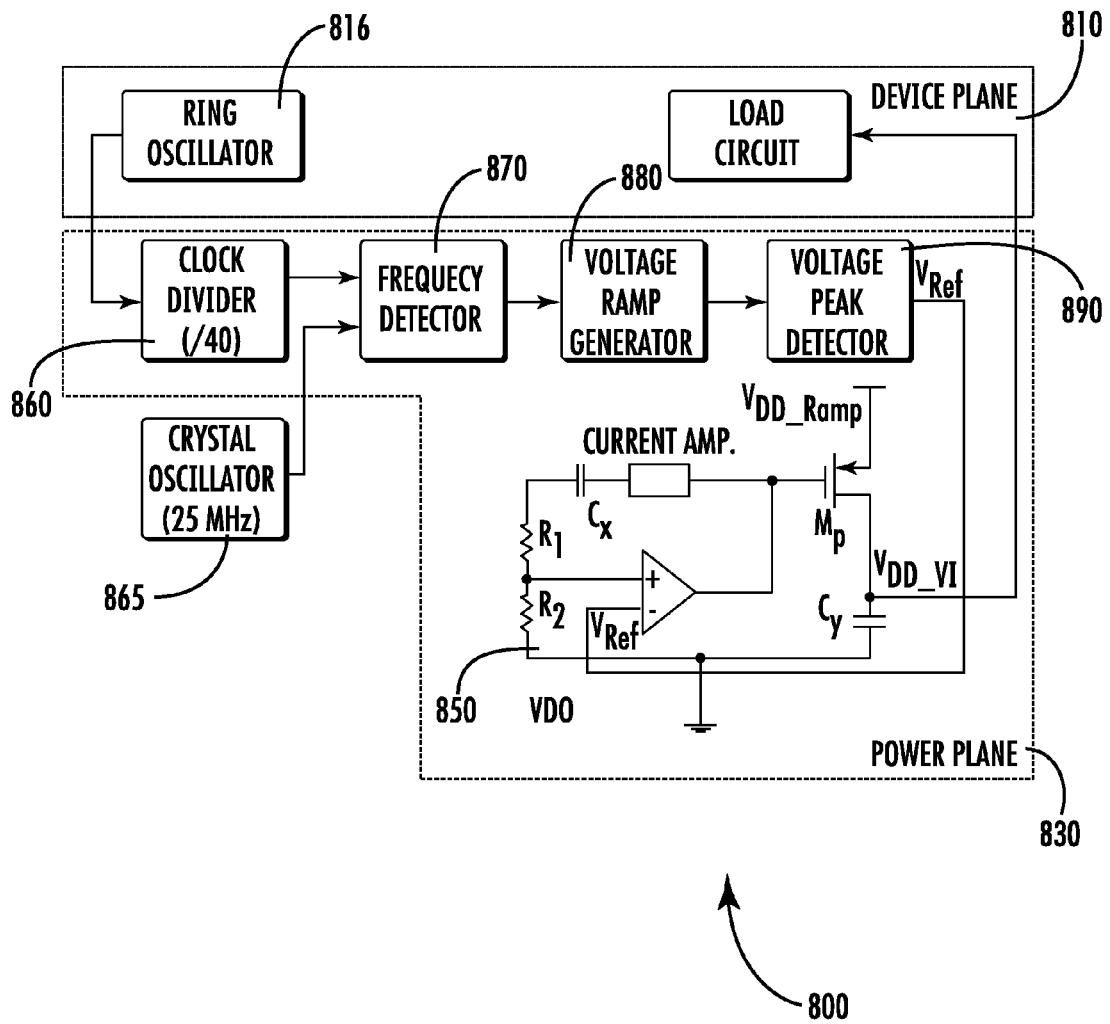
FIG. 8 shows a block diagram of the various components of the 3-D IC supply voltage detection and clamping circuit.

FIG. 8 shows a block diagram of the various components of a 3-D IC supply voltage detection and clamping circuit 800. Each voltage domain in the device plane 810 comprises a ring oscillator 816 with a current-starved output switching stage. The ring oscillator 816 operates at a frequency of 1 GHz when the applied control voltage equals the power supply voltage of the given domain. The oscillation frequency of 1 GHz is selected and achievable with minimum current starved inverter stages in a deep sub-micron CMOS technology as well as in GaAs based RF circuits. The power module 830 that serves a voltage domain consists of a clock divider 860, frequency detector 870, voltage ramp generator 880, voltage peak detector 890, and a voltage regulator 850.

Figure 9A:
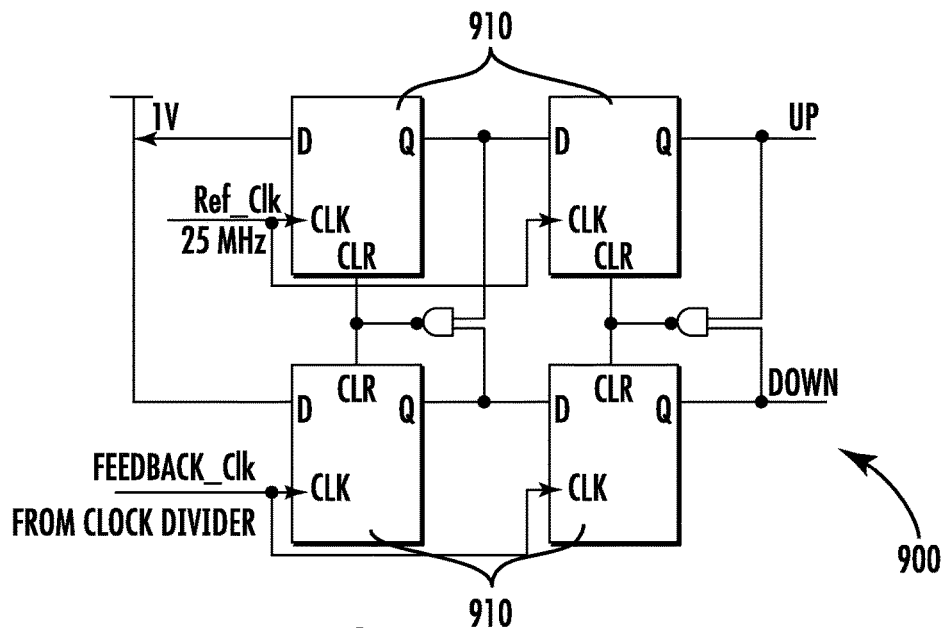
FIGS. 9(a)-9(c) show various circuit details described herein.

The ring oscillator 816 output frequency may be down-converted by a factor of 40 by the clock divider 860 comprising a divide-by-8 cascaded together with a divide-by-5 circuit block. The frequency comparator compares the output of the clock divider 860 with a 25 MHz clock source (off-chip crystal oscillator) 865. The frequency comparator 900 may be implemented using four D-FFs 910 as shown in FIG. 9(a). The frequency comparator may be preferable over a phase frequency detector (PFD) as the PFD generates UP and DOWN signals (due to D-FF clock-to-Qdelay) even when the inputs are phase locked. In addition, the voltage detection circuit does not require that the down converted ring oscillator frequency is matched in phase with the 25 MHz reference signal.

Figure 9B:
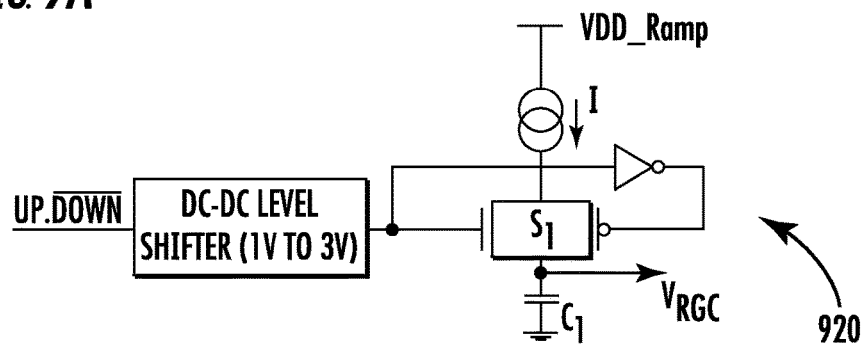

A voltage ramp generator circuit (RGC) 920 includes a constant current source charging a capacitor C1 and a switch S1 that controls the duration of the ramp voltage, as shown in FIG. 9(b). The UP and inverted DOWN signal are logically ANDed together (UP●DOWN) to generate the control signal for S1. When the 3-D IC is first powered on, the ramp generator provides an initial voltage to the ring oscillator, and the UP signal from the frequency detector is high as the down converted frequency from the ring oscillator is less than 25 MHz. The frequency increases as the ramp generator output voltage increases. When the ring oscillator reaches the 1 GHz frequency, the UP signal may be de-asserted and any further increase in frequency asserts the DOWN signal. The switch S1 is in the open state, preventing any further increase of charge (and therefore voltage) on C1. The voltage VRGC on C1 corresponds to the power supply voltage of the voltage domain (VDD_VI) in which the ring oscillator is placed. The discharging of the capacitor C1 through the load circuit causes the ring oscillator frequency to drop below 1 GHz, which re-asserts the UP signal and places S1 in the closed state. The UP signal continues to periodically toggle ensuring that the voltage VRGC is maintained at the desired level.

Figure 9C:
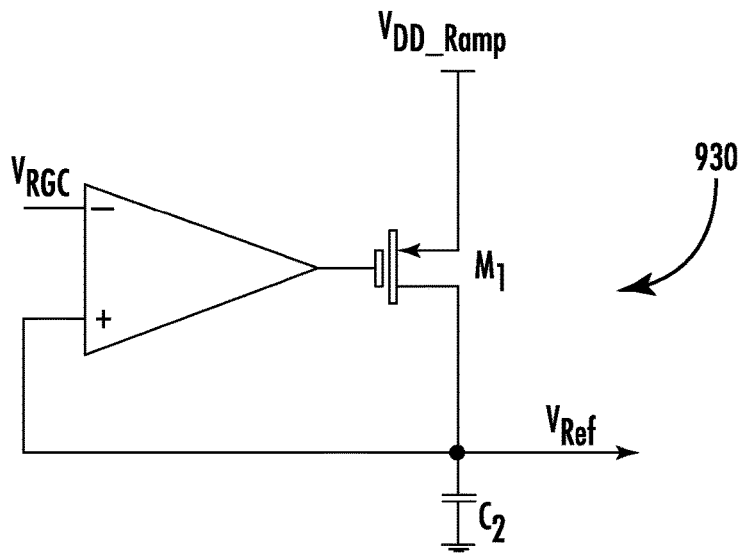

The variations in VRGC due to discharging of the capacitor C1 are filtered using a voltage peak detector circuit 930 (shown in FIG. 9(c). The peak detector circuit consists of a PMOS M1 that controls the current charging the capacitor C2. A voltage comparator compares the output voltage VRef across the capacitor C2 with VRGC. The output voltage from the comparator biases M1. VRef follows the positive transition of VRGC and at steady state equals the maximum value of VRGC. The peak detector circuit therefore provides a steady voltage reference with less than 1% ripple voltage variation from the targeted power supply voltage of the device plane (VDD_VI). VRef is used as the reference voltage for the voltage regulator serving the load circuit in the device plane. On-chip voltage regulator topologies like the LDO and buck converter are suitable for integration with the proposed voltage detection and clamping circuit. The stable reference voltage provided by the proposed circuit ensures superior line regulation offered by the voltage regulator.

VI. SIMULATED CIRCUIT RESULTS

Two device planes may be simulated using the 45 nm low-performance (LP) (VDD_VI of 1 V) and 22 nm high-performance (HP) (VDD_VI of 0.8 V) PTM models [6]. The designed ring oscillators for each device plane include three inverter stages in a current starved output-switching configuration. The design is robust against threshold voltage variation, channel length variation, and low-field mobility variation.

The components of the power module may be implemented with the 45 nm PTM models. The divide-by-40 clock divider and frequency detector circuits are simulated using the 45 nm LP PTM model (VDD_PP of 1 V). The voltage ramp generator and peak detector circuits are implemented using the 45 nm thick oxide (VDD_Ramp of 3 V) PTM model. A DC-DC level shifter is used to convert the UP and DOWN signals from a VDD_PP of 1 V to a VDD_Ramp of 3 V. The slope of the voltage ramp signal is deliberately kept low (0 V to 3 V in 2 µs) to ensure stable operation. The minimum voltage detected reliably by the power module is 0.7 V. The maximum voltage provided by the ramp generator is 2.5 V. SPICE circuit simulations indicate a maximum variation of 1% in the reference voltage VRef provided to the on-chip voltage regulator for VDD_VI of less than 1 V. This is comparable to the stability of reference voltages used by off-chip buck converters, where approximately 1% variation is currently achieved.

Figure 3:
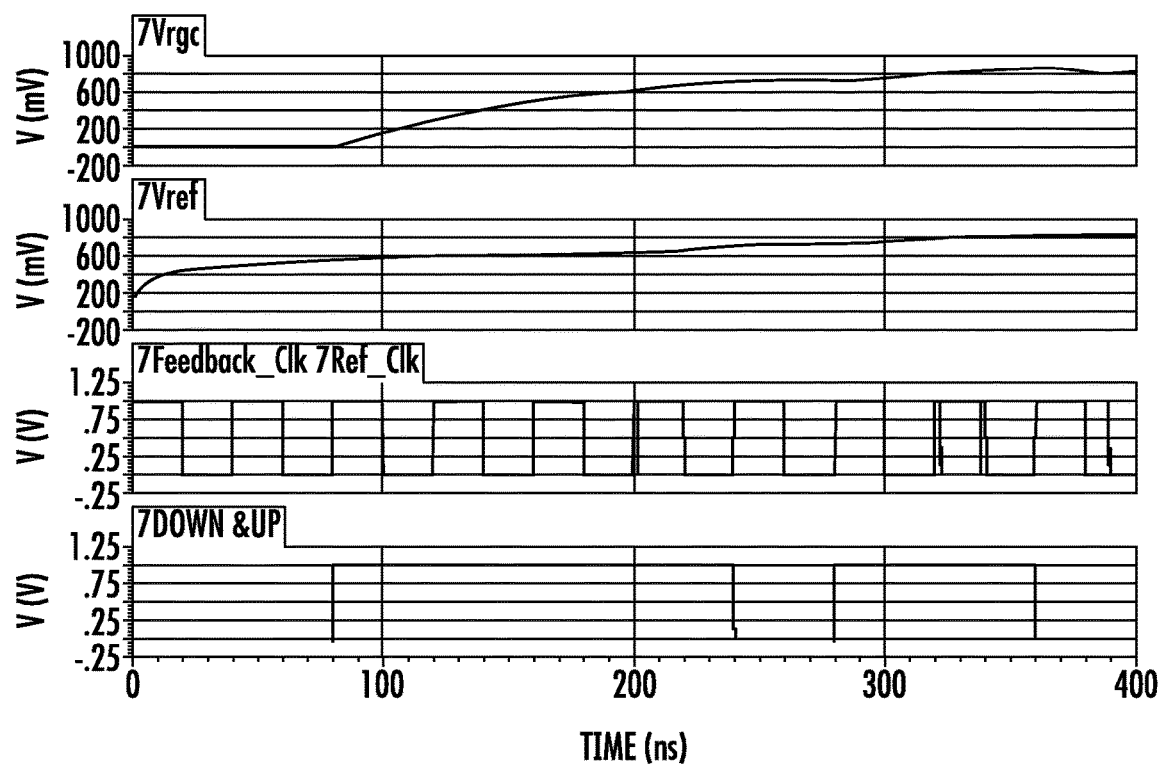
FIG. 3 shows the simulation results for detecting and clamping the power supply voltage for a voltage domain in a 22 nm device plane.

The simulation results for detecting and clamping the power supply voltage for a voltage domain in a 22 nm device plane are shown in FIG. 3. VRef reaches VDD_VI of 0.8 V in 370 ns. The detection and clamping circuits on the 45 nm device plane require 420 ns for VRef to reach the target voltage VDD_VI of 1 V. The proposed circuit therefore offers a fast transition to the desired power supply voltage level at startup and is suitable for integration with on-chip voltage regulators.

VII. OTHER APPLICATIONS

Other applications of the circuits described herein may be as a way to maintain consistent voltage over time to overcome degradation. The power supply power detection and power delivery unit could, through its detection ability, detect any degradation and maintain consistent voltage through the circuit.

The power supply detection and power delivery unit may auto compensate for the drift in power supply voltage with time due to the aging of devices in each voltage domain served by a ring oscillator.

Further, the units may be fabricated in a 2-D or 3-D IC. The units may provide run-time aging or process, voltage, and temperature (PVT) variation detection and correction used in conjunction with on-chip voltage regulators.

The power supply detection and power delivery unit may be part of a power conditioning circuit of a battery charged portable electronic device and the power delivery unit is integrated into a portable charger. The run-time voltage detection mechanism eliminates the need to down convert the voltage from 5V as obtained through standard USB based battery chargers.

VIII. CONCLUSIONS

A mechanism to detect the power supply voltage of a given voltage domain in a 3-D IC is implemented by placing a ring oscillator in each domain located on disparate device planes. The chosen circuit topology for the ring oscillator exhibits acceptable response to deviations due to PVT variations in a 22 nm technology. A u/p ratio (as a percentage) of 11.9%, 5.64%, and 6.12% is determined for, respectively, threshold voltage variation, channel length variation, and low-field mobility. The power requirement of each voltage domain is served by a single power plane that includes multiple point of load power modules, with each module consisting of a voltage controlled voltage source regulated by a frequency to voltage converter. The power supply voltage detection and delivery mechanism is demonstrated by simulating the device plane and power plane in two different technology nodes. The targeted power supply voltage for both the 22 nm and 45 nm device planes is detected and set in less than 100 ns, as shown through simulation.

A circuit to detect and reliably set the power supply voltage of a given voltage domain in a 3-D IC is also described. All components except for a ring oscillator are part of the power module located in a separate and dedicated 45 nm power plane. Multiple power modules serve as point of load voltage delivery circuits to the different device planes. Correct power supply voltage detection and clamping is demonstrated through circuit simulation for two device planes, one in 22 nm and the other in 45 nm technologies. The power module is capable of setting the power supply voltage of a device plane ranging from 0.7 V to 2.5 V. The precise voltage generated from the power module acts as a reference voltage for an on-chip LDO or buck converter. The reference voltage is within 1% of the targeted power supply voltage, as indicated by simulated results.

The power regulation described herein has been made in reference to ICs and in particular IC manufacture with layers produced separately. Other uses of the device described herein, however, are possible, including the use of the device as a universal power converter that could be used to allow for power differences between electric devices and power delivery systems.

While the invention has been described with reference to the embodiments above, a person of ordinary skill in the art would understand that various changes or modifications may be made thereto without departing from the scope of the claims.

The invention claimed is:

1. A power supply detection and power delivery unit comprising:
a device plane comprising a voltage domain served by a power plane with a power module that delivers power to the device plane, wherein each power module includes a voltage-controlled voltage source (VCVS) controlled by voltage generated from a frequency to voltage converter (FVC), wherein a ring oscillator in each voltage domain provides a controlling frequency to the FVC.

2. The power supply detection and power delivery unit of claim 1, wherein the frequency generated by the ring oscillator propagates through through silicon vias (TSVs) to the power plane.

3. The power supply detection and power delivery unit of claim 1, wherein the FVC generates a voltage inversely proportional to Fout.

4. The power supply detection and power delivery unit of claim 1, wherein the ring oscillator frequency increases until 1 GHz is reached, which is determined by comparing an FVC output voltage to a reference voltage.

5. The power supply detection and power delivery unit of claim 4, wherein the VCVS is controlled by a voltage comparator that compares the FVC voltage to the reference voltage.

6. The power supply detection and power delivery unit of claim 1, wherein the VCVS supplies the control voltage to the ring oscillator.

7. The power supply detection and power delivery unit of claim 1, wherein the unit auto compensates for a drift in power supply voltage with time due to aging of devices in each voltage domain served by the ring oscillator.

8. The power supply detection and power delivery unit of claim 1, wherein the unit is fabricated in a 2-D or 3-D IC.

9. The power supply detection and power delivery unit of claim 1, wherein the unit provides device aging detection using an on-unit voltage regulator.

10. The power supply detection and power delivery unit of claim 1, wherein the unit provides process, voltage, and temperature (PVT) variation detection and correction using an on-unit voltage regulator.

11. The power supply detection and power delivery unit of claim 1, wherein the power supply detection unit is part of a power conditioning circuit of a battery charged portable electronic device and the power delivery unit is integrated into a portable charger.

12. A circuit that detects and sets a power supply voltage of a given device plane in a 3-D IC comprises:
a ring oscillator in a voltage domain located in each device plane, and
a power module placed in a dedicated power plane, wherein the power module comprises a clock divider, which is in communication with a frequency detector, which is in communication with a voltage ramp generator, which is in communication with a voltage peak detector circuit, wherein the power module provides a stable reference voltage equal to a power supply voltage of a targeted voltage domain in the device plane.

13. The circuit of claim 12, wherein the power module is integrated with on-chip voltage regulators.

14. The circuit of claim 12, wherein the frequency generated by the ring oscillator propagates through through silicon vias (TSVs) to the power plane.

15. The circuit of claim 12, wherein each power module includes a voltage-controlled voltage source (VCVS) controlled by voltage generated from a frequency to voltage converter (FVC), wherein a ring oscillator in each voltage domain provides a controlling frequency to the PVC.

16. The circuit of claim 15, wherein a FVC generates a voltage inversely proportional to Fout.

17. The circuit of claim 15, wherein the ring oscillator frequency increases until 1 GHz is reached, which is determined by comparing an FVC output voltage to a reference voltage.

18. The circuit of claim 15, wherein a VCVS is controlled by a voltage comparator that compares the FVC voltage to the reference voltage.

* * * * *